(12) United States Patent
Teig et al.

(10) Patent No.: US 6,892,369 B2
(45) Date of Patent: May 10, 2005

(54) METHOD AND APPARATUS FOR COSTING ROUTES OF NETS

(75) Inventors: Steven Teig, Menlo Park, CA (US); Jonathan Frankle, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 96 days.

(21) Appl. No.: 10/335,086

(22) Filed: Dec. 31, 2002

(65) Prior Publication Data

US 2004/0098692 A1 May 20, 2004

Related U.S. Application Data

(60) Provisional application No. 60/427,131, filed on Nov. 18, 2002.

(51) Int. Cl.[7] .............................................. G06F 17/50
(52) U.S. Cl. ............................. 716/12; 716/4; 716/13; 716/14; 716/15
(58) Field of Search ................................. 716/4, 12–15

(56) References Cited

U.S. PATENT DOCUMENTS

| | | |
|---|---|---|
| 4,615,011 A | 9/1986 | Linsker |
| 4,673,966 A | 6/1987 | Shimoyma |
| 4,777,606 A | 10/1988 | Fournier |

(Continued)

FOREIGN PATENT DOCUMENTS

| | | |
|---|---|---|
| JP | 64-15947 | 1/1989 |
| JP | 02-262354 | 10/1990 |
| JP | 03-173471 | 7/1991 |
| JP | 04-000677 | 1/1992 |
| JP | 05-102305 | 4/1993 |
| JP | 05-243379 | 9/1993 |
| JP | 07-086407 | 3/1995 |
| JP | 09-162279 | 6/1997 |
| JP | 11-296560 | 10/1999 |
| JP | 2000-082743 | 3/2000 |

OTHER PUBLICATIONS

Juttner et al., "Lagrange Relaxation Based Method for the QoS Routing Problem," IEEE, Apr. 26, 2001, pp. 859–868.*
U.S. Appl. No. 10/066,060, filed Jan. 31, 2002, Steven Teig.
U.S. Appl. No. 10/066,160, filed Jan. 31, 2002, Steven Teig et al.
U.S. Appl. No. 10/066,095, filed Jan. 31, 2002, Steven Teig et al.
U.S. Appl. No. 10/066,047, filed Jan. 31, 2002, Steven Teig et al.
U.S. Appl. No. 10/061,641, filed Jan. 31, 2002, Steven Teig et al.
U.S. Appl. No. 10/066,094, filed Jan. 31, 2002, Steven Teig et al.
U.S. Appl. No. 10/076,121, filed Feb. 12, 2002, Steven Teig et al.
U.S. Appl. No. 10/062,995, filed Jan. 31, 2002, Steven Teig et al.
U.S. Appl. No. 10/066,102, filed Jan. 31, 2002, Steven Teig.
U.S. Appl. No. 10/066,187, filed Jan. 31, 2002, Steven Teig et al.
U.S. Appl. No. 10/286,584, filed Oct. 31, 2002, Steven Teig.

(Continued)

Primary Examiner—Vuthe Siek
(74) Attorney, Agent, or Firm—Stattler, Johansen, and Adeli LLP

(57) ABSTRACT

Some embodiments of the invention provide a method of costing routes for a set of nets. The method identifies at least one route for each net, where each route has a particular length. It also identifies an estimated route length for each net. It then computes a cost that includes an exponential expression for each net. Each net's exponential expression includes a base and an exponent. The exponent of each net's exponential expression includes the length of the net's route divided by the estimated route length for the net.

20 Claims, 5 Drawing Sheets

U.S. PATENT DOCUMENTS

| | | | |
|---|---|---|---|
| 4,782,193 A | | 11/1988 | Linsker |
| 4,855,929 A | | 8/1989 | Nakajima |
| 5,224,057 A | | 6/1993 | Igarashi et al. |
| 5,360,948 A | | 11/1994 | Thornberg |
| 5,375,069 A | | 12/1994 | Satoh et al. |
| 5,519,836 A | * | 5/1996 | Gawlick et al. ............ 709/241 |
| 5,532,934 A | | 7/1996 | Rostoker |
| 5,578,840 A | | 11/1996 | Scepanovic et al. |
| 5,618,744 A | | 4/1997 | Suzuki et al. |
| 5,633,479 A | | 5/1997 | Hirano |
| 5,634,093 A | | 5/1997 | Ashida et al. |
| 5,635,736 A | | 6/1997 | Funaki et al. |
| 5,636,125 A | | 6/1997 | Rostoker et al. |
| 5,637,920 A | | 6/1997 | Loo |
| 5,650,653 A | | 7/1997 | Rostoker et al. |
| 5,657,242 A | | 8/1997 | Sekiyama et al. |
| 5,659,484 A | | 8/1997 | Bennett et al. |
| 5,663,891 A | | 9/1997 | Bamji et al. |
| 5,717,600 A | | 2/1998 | Ishizuka |
| 5,723,908 A | | 3/1998 | Fuchida et al. |
| 5,742,086 A | | 4/1998 | Rostoker et al. |
| 5,757,089 A | | 5/1998 | Ishizuka |
| 5,757,656 A | | 5/1998 | Hershberger et al. |
| 5,777,360 A | | 7/1998 | Rostoker et al. |
| 5,811,863 A | | 9/1998 | Rostoker et al. |
| 5,822,214 A | | 10/1998 | Rostoker et al. |
| 5,838,583 A | | 11/1998 | Varadarajan et al. |
| 5,856,927 A | | 1/1999 | Greidinger et al. |
| 5,859,449 A | | 1/1999 | Kobayashi et al. |
| 5,877,091 A | | 3/1999 | Kawakami |
| 5,880,969 A | | 3/1999 | Hama et al. |
| 5,889,329 A | | 3/1999 | Rostoker et al. |
| 5,889,677 A | | 3/1999 | Yasuda et al. |
| 5,898,597 A | | 4/1999 | Scepanovic et al. |
| 5,914,887 A | | 6/1999 | Scepanovic et al. |
| 5,973,376 A | | 10/1999 | Rostoker et al. |
| 5,978,572 A | * | 11/1999 | Toyonaga et al. ............ 716/5 |
| 5,980,093 A | | 11/1999 | Jones et al. |
| 6,006,024 A | | 12/1999 | Guruswamy et al. |
| 6,035,108 A | | 3/2000 | Kikuchi |
| 6,038,383 A | | 3/2000 | Young et al. |
| 6,058,254 A | | 5/2000 | Scepanovic et al. |
| 6,067,409 A | | 5/2000 | Scepanovic et al. |
| 6,068,662 A | | 5/2000 | Scepanovic et al. |
| 6,085,032 A | * | 7/2000 | Scepanovic et al. .......... 716/10 |
| 6,088,519 A | | 7/2000 | Koford |
| 6,110,222 A | | 8/2000 | Minami et al. |
| 6,111,756 A | | 8/2000 | Moresco |
| 6,123,736 A | | 9/2000 | Pavisic et al. |
| 6,128,767 A | | 10/2000 | Chapman |
| 6,154,873 A | | 11/2000 | Takahashi |
| 6,154,874 A | | 11/2000 | Scepanovic et al. |
| 6,155,725 A | | 12/2000 | Scepanovic et al. |
| 6,166,441 A | | 12/2000 | Geryk |
| 6,175,870 B1 | * | 1/2001 | Gawlick et al. ............ 709/227 |
| 6,175,950 B1 | | 1/2001 | Scepanovic et al. |
| 6,209,123 B1 | | 3/2001 | Maziasz et al. |
| 6,216,252 B1 | | 4/2001 | Dangelo et al. |
| 6,219,823 B1 | | 4/2001 | Hama et al. |
| 6,219,832 B1 | | 4/2001 | Buzbee |
| 6,226,560 B1 | | 5/2001 | Hama et al. |
| 6,230,306 B1 | | 5/2001 | Raspopovic et al. |
| 6,247,167 B1 | | 6/2001 | Raspopovic et al. |
| 6,247,853 B1 | | 6/2001 | Papadopoulou et al. |
| 6,253,363 B1 | | 6/2001 | Gasanov et al. |
| 6,260,179 B1 | | 7/2001 | Ohsawa et al. |
| 6,262,487 B1 | | 7/2001 | Igarashi et al. |
| 6,286,128 B1 | | 9/2001 | Pileggi et al. |
| 6,289,495 B1 | | 9/2001 | Raspopovic et al. |
| 6,292,929 B2 | | 9/2001 | Scepanovic et al. |
| 6,295,634 B1 | | 9/2001 | Matsumoto |
| 6,301,686 B1 | | 10/2001 | Kikuchi et al. |
| 6,324,674 B2 | | 11/2001 | Andreev et al. |
| 6,324,675 B1 | | 11/2001 | Dutta et al. |
| 6,327,693 B1 | | 12/2001 | Cheng et al. |
| 6,327,694 B1 | | 12/2001 | Kanazawa |
| 6,330,707 B1 | | 12/2001 | Shinomiya et al. |
| 6,349,403 B1 | | 2/2002 | Dutta et al. |
| 6,378,121 B2 | | 4/2002 | Hiraga |
| 6,385,758 B1 | | 5/2002 | Kikuchi et al. |
| 6,401,234 B1 | | 6/2002 | Alpert et al. |
| 6,405,358 B1 | | 6/2002 | Nuber |
| 6,407,434 B1 | | 6/2002 | Rostoker et al. |
| 6,412,097 B1 | | 6/2002 | Kikuchi et al. |
| 6,412,102 B1 | | 6/2002 | Andreev et al. |
| 6,415,427 B2 | | 7/2002 | Nitta et al. |
| 6,434,730 B1 | | 8/2002 | Ito et al. |
| 6,436,804 B2 | | 8/2002 | Igarashi et al. |
| 6,442,745 B1 | | 8/2002 | Arunachalam et al. |
| 6,463,575 B1 | | 10/2002 | Takahashi |
| 6,473,891 B1 | | 10/2002 | Shively |
| 6,490,713 B2 | | 12/2002 | Matsumoto |
| 6,505,331 B1 | | 1/2003 | Bracha et al. |
| 6,519,751 B2 | * | 2/2003 | Sriram et al. ................ 716/13 |
| 6,526,555 B1 | | 2/2003 | Teig et al. |
| 6,543,043 B1 | | 4/2003 | Wang et al. |
| 6,546,540 B1 | | 4/2003 | Igarashi et al. |
| 6,557,145 B2 | | 4/2003 | Boyle et al. |
| 6,567,967 B2 | | 5/2003 | Greidinger et al. |
| 6,586,281 B1 | | 7/2003 | Gabara et al. |
| 6,601,227 B1 | | 7/2003 | Trimberger |
| 6,609,237 B1 | | 8/2003 | Hamawaki et al. |
| 6,618,846 B2 | * | 9/2003 | Cheng ......................... 716/5 |
| 6,645,842 B2 | | 11/2003 | Igarashi et al. |
| 6,656,644 B2 | | 12/2003 | Hasegawa et al. |
| 6,665,852 B2 | | 12/2003 | Xing et al. |
| 2001/0003843 A1 | | 6/2001 | Scepanovic et al. |
| 2001/0038612 A1 | | 11/2001 | Vaughn et al. |
| 2002/0043988 A1 | | 4/2002 | Or-Bach et al. |
| 2002/0100009 A1 | | 7/2002 | Xing et al. |
| 2002/0104061 A1 | | 8/2002 | Xing et al. |
| 2002/0107711 A1 | | 8/2002 | Xing et al. |
| 2002/0174413 A1 | | 11/2002 | Tanaka |
| 2002/0182844 A1 | | 12/2002 | Igarashi et al. |
| 2003/0005399 A1 | | 1/2003 | Igarashi et al. |
| 2003/0009737 A1 | | 1/2003 | Xing |
| 2003/0014725 A1 | | 1/2003 | Sato et al. |
| 2003/0025205 A1 | | 2/2003 | Shively |
| 2003/0121017 A1 | | 6/2003 | Andreev et al. |
| 2003/0188281 A1 | | 10/2003 | Xing |
| 2003/0217338 A1 | | 11/2003 | Holmes et al. |
| 2004/0015805 A1 | | 1/2004 | Kidd et al. |
| 2004/0040007 A1 | | 2/2004 | Harn |
| 2004/0044979 A1 | * | 3/2004 | Aji et al. ..................... 716/13 |
| 2004/0088670 A1 | | 5/2004 | Stevens et al. |

OTHER PUBLICATIONS

U.S. Appl. No. 10/335,087, filed Dec. 31, 2002, Steven Teig et al.

U.S. Appl. No. 10/335,239, filed Dec. 31, 2002, Steven Teig et al.

Chen, H.F. et al., A Faster Algorithm for Rubber–Band Equivalent Transformation for Planar VLSI Layouts, IEEE Transactions on Computer–Aided Design of Integrated Circuits and Systems, vol. 15, No. 2, Feb. 1996, pp. 217–227.

Chip Model with Wiring Cost Map, Aug. 1983, IBM Technical Disclosure Bulletin, vol. 26, issu. 3A, pp. 929–933.

Dayan, T. et al., Layer Assignment for Rubber Band Routing, UCSC–CRI–93–04, Jan. 20, 1993.

Dayan, T., Rubber–Band Based Topological Router, A Dissertation, UC Santa Cruz, Jun. 1997.

Dood, P. et al. A Two–Dimensional Topological Compactor with Octagonal Geometry, 28$^{th}$ ACM/IEEE Design Automation Conference, pp 727–731, Jul. 1991.

Fujimura, K. et al, Homotopic Shape Deformation.

Hama, T. et al., Curvinlinear Detailed Routing Algorithm and its Extension to Wire–Spreading and Wire–Fattening.

Hama, T. et al., Topological Routing Path Search Algorithm with Incremental Routability Test, IEEE Transactions on Computer–Aided Design of Integrated Circuits and Systems, vol. 18, No. 2, Feb. 1999, pp. 142–150.

Kobayashi, K. et al., A New Interactive Analog Layout Methodology based on Rubber–Band Routing, UCSC–CRL–96–12, Jun. 13, 1996.

Lim, A. et al, A Fast Algorithm To Test Planar Topological Routability, Technical Report 94–012, pp. 1–16.

Lu, Y., Dynamic Constrained Delaunay Triangulation and Application to Multichip Module Layout, A Thesis for Master of Science, UC Santa Cruz, Dec. 1991.

Maley, F. M., Testing Homotopic Routability Under Polygonal Wiring Rules, Algorithmica 1996, 15: 1–16.

Morton, P. B. et al., An Efficient Sequential Quadratic Programming Formulation of Optimal Wire Spacing for Cross–Talk Noise Avoidance Routing, UCSC–CRL–99–05, Mar. 10, 1999.

NN71091316, Use of Relatively Diagonal And Rectangular Wiring Planes n Multilayer Packages, Sep. 1971, IBM Technical Disclosure Bulletin, vol. No. 14, Issue No. 4, pp. 1316–1317.

Staepelaere, D. et al., Geometric Transformations for a Rubber–Band Sketch, A Thesis for a Master of Science in Computer Engineering, UCSC, Sep. 1992.

Staepelaere, D. et al., Surf: A Rubber–Band Routing System for Multichip Modules, pp 18–26, 1993.

Su, J. et al., Post–Route Optimization for Improved Yield Using Rubber–Band Wiring Model, 1997 International Conference on Computer–Aided Design, pp 700–706, Nov. 1997.

Wei–Ming Dai, W. et al., Routability of a Rubber–Band Sketch. 28$^{th}$ ACM–IEEE Design Automation Conference, 1991. pp. 45–65.

Xing, Z. et al., A Minimum Cost Path Search Algorithm Through Tile Obstacles, slide presentation.

Xing, Z. et al., Shortest Path Search Using Tiles and Piecewise Linear Cost Propagation, IEEE, 2002, pp. 145–158.

Xu, A More Efficient Distance Vector Routing Algorithm, UCSC–CRL–96–18, Mar. 1997.

Yu, M.–F. et al., Fast and Incremental Routability Check of a Topological Routing Using a Cut–Based Encoding, UCSC–CRL–97–07, Apr. 14, 1997.

Yu, M.–F. et al, Interchangeable Pin Routing with Application to Package Layout, UCSC–CRL–96–10, Apr. 25, 1996.

Yu, M.–F. et al., Pin Assignment and Routing on a Single–Layer Pin Grid Array, UCSC–CRL–95–15, Feb. 24, 1995.

Yu, M.–F. et al., Planar Interchangeable 2–Terminal Routing, UCSC–CRL–95–49, Oct. 19, 1995.

Yu, M.–F. et al., Single–Layer Fanout Routing and Routability Analysis for Ball Grid Arrays, UCSC–CRL–95–18, Apr. 25, 1995.

Ahuja, R. et al., Faster Algorithms for the Shortest Path Problem, Journal of the Association for Computing Machinery, vol. 37, No. 2, Apr. 1990, pp. 213–223.

Alexander, M. et al., Performance–Oriented Placement and Routing for field–programmable gate arrays, Proceedings of the European Design Automation Conference, pp. 80–85, 1995.

Alexander, M. et al., Placement and Routing for Performance–Oriented FPGA Layout, VLSI Design, vol. 7. No. 1, 1998.

Andou, H. et al., Automatic Routing Algorithm for VLSI, 22$^{nd}$ Design Automation Conference, 1985, pp. 785–788.

Bagga, J. et al., Internal, External, and Mixed Visibility Edges of Polygons.

Berger, B. et al., Nearly Optimal Algorithms and Bounds for Multilayer Channel Routing, Journal of the Association for Computing Machinery, pp. 500–542, Mar. 1995.

Brady, L. et al., Channel Routing of a 60° Grid, extended abstract, pp. 926–931.

Carothers, K., A Method of Measuring Nets Routability for MCM's General Area Routing Problems, 1999, pp. 186–192.

Chen, D–S. et al., A Wire–Length Minimization Algorithm for Single–Layer Layouts.

Chen et al., Optimal Algorithms for Bubble Sort Based Non–Manhattan Channel Routing, May 1994, Computer–Aided Design of Integrated Circuits and Systems, IEEE Transactions vol.: 13 Issues, pp. 603–609.

Chen, H., Routing L–Shaped Channels in Nonslicing–Structure Placement. 24$^{th}$ ACM–IEEE Design Automation Conference, pp. 152–165, 1987.

Chen, H. et al., Physical Planning of On–Chip Interconnect Architectures, 2002, IEEE, International Conference, pp. 30–35.

Chen, S.–S. et al., A New Approach to the Ball Grid Array Package Routing, IEICE Trans. Fundamentals, vol. E82–A, No. 11, Nov., 1999, pp. 2599–2608.

Cheng, K. et al., Manhattan or Non Manhattan? A Study of Alternative VLSI Routing Architectures, pp 47–52, 2000.

Cheng, K., Steiner Problem in Octilinear Routing Model, A Thesis submitted for the Degree of Master of Science, National University Singapore, 1995, pp. 1–122.

Chiang, C. et al., Wirability of Knock–Knee Layouts with 45° Wires, IEEE Transactions on Circuits and Systems, vol. 38, Issue 6, pp 613–624, Jun. 1991.

Cong, J. et al., Efficient Heuristics for the Minimum Shortest Path Steiner Aborescence Problem with Applications to VLSI Physical Design, Cadence Design Systems, pp. 88–95.

Cong, J. et al., Multilevel Approach to Full Chip Gridless Routing, Nov. 2001, IEEE, pp. 396–403.

Cong, J. et al., Performance Driven Multi–Layer General Routing for PCB/MCM Designs, UCLA Computer Science Department, 1998, pp. 356–361.

Das, S. et al., Channel Routing in Manhattan–Diagonal Model, 9$^{th}$ International Conference on VLSI Design, Jan. 1996. pp. 43–48.

Das, S. et al., Routing of L–Shaped Channels, Switchboxes and Staircases in Manhattan–Diagonal Model, pp. 65–70, Jan. 1998.

Enbody, R. et al., Near–Optimal n–Layer Channel Routing, 23$^{rd}$ Design Automation Conference, 1986, pp. 708–714.

Finch, A.C. et al., A Method for Gridless Routing of Printed Circuit Boards, 22$^{nd}$ Design Automation Conference, 1985 ACM, pp. 509–515.

Gao, S. et al., Channel Routing of Multiterminal Nets, Journal of the Association for Computing Machinery, vol. 41, No. 4, Jul. 1994, pp. 791–818.

Gao, T. et al., Minimum Crosstalk Channel Routing, pp. 692–696, 1993 IEEE.

Gao, T. et al., Minimum Crosstalk Switchbox Routing, pp. 610–615, 1994 ACM.

Gonzalez, T. et al., A Linear Time–Algorithm for Optimal Routing, Journal of the Association for Computing Machinery, vol. 35, No. 4, Oct. 1988, pp. 810–831.

Guibas, L. et al., Optimal Shortest Path Queries in a Simple Polygon, 1987 ACM, pp. 50–63.

Hachtel, G.D. et al., Linear Complexity Algorithms for Hierarchical Routing, Jan. 1989, IEEE pp 64–80.

Hershberger, J., Efficient Breakout Routing in Printed Circuit Boards, Computational Geometry, 1997, ACM, pp. 460–462.

Hershberger, J., Finding the Visibility Graph of a Simple Polygon in Time Proportional to its Size, Preliminary Version, 1987 ACM, pp. 11–20.

Hightower, D., A Solution to Line–Routing Problems on the Continuous Plane, Bell Laboratories, Inc., pp. 11–34.

Iso, N. et al., Efficient Routability Checking for Global Wires in Planar Layouts, IEICE Trans. Fundamentals, Vol. E80–A, No. 10 Oct. 1997, pp. 1878–1882.

Khoo, K. et al., An Efficient Multilayer MCM Router Based on Four–Via Routing, 30th ACM/IEEE Design Automation Conference, 1993, pp. 590–595.

Ladage, L. et al., Resistance Extraction Using a Routing Algorithm, 30th ACM/IEEE Design Automation Conference, 1993, pp. 38–42.

Leach, G., Improving Worst–case Optimal Delaunay Triangulation Algorithms, Department of Computer Science, Jun. 15, 1992, pp. 1–7.

Leiserson, C. et al., Algorithms for Routing and Testing Routability of Planar VLSI Layouts, pp. 69–78, May 1985.

Lillis, J. et al., New Performance Driven Routing Techniques With Explicit Area/Delay Tradeoff and Simultaneous Wire Sizing, 33rd Design Automation Conference, 1996.

Lipski, W. et al., A Unified Approach to Layout Wirability, Mathematical Systems Theory, 1987, pp. 189–203.

Lodi, E. et al., A 2d Channel Router for the Diagonal Model, pp. 111–125, Apr. 1991.

Lodi, E. et al., A Preliminary Study of a Diagnonal Channel–Routing Model, Algorithmica, 1989, pp. 585–597.

Lodi, E. et al., Lecture Notes in Computer Science, A 4d Channel router for a two layer diagonal model, pp. 464–476, Jul. 1988.

Lodi, E. et al., Routing in Times Square Mode, pp. 41–48, Jun. 1990.

Lodi, E. et al., Routing Multiterminal Nets in a Diagonal Model, pp. 899–902, 1988.

Murooka, T. et al., Simplified Routing Procedure for a CAD–Verified FPGA, IEICE Trans. Fundamentals, vol. E82–A, No. 11 Nov. 1999, pp. 2440–2447.

Naclerio, N. et al., Via Minimization for Gridless Layouts, 24th ACM/IEEE Design Automation Conference, 1987, pp. 159–165.

Nam, G. et al, Satisfiability–Based Layout Revisited: Detailed Routing of Complex FPGAs Via Search–Based Boolean SAT, 1999, pp. 167–175.

Nestor, J. A New Look at Hardware Maze Routing, Proceedings of the 12th ACM Symposium on Great Lakes Symposium on VLSI, pp 142–147, Apr. 2002.

Ng, C., A "Gridless" Variable–Width Channel Router for Macro Cell Design, 24th ACM/IEEE Design Automation Conference, 1987, pp. 633–636.

Olaverri, A.G. et al., On the Minimum Size of Visibility Graphs.

Overtone, G., EDA Underwriter 2 Finding Space in a Multi–Layer Board, Electronic Engineering, Morgan–Grampian LTD, Mar. 1995, vol. 67, No. 819, pp 29–30.

Pocchiola, M., Computing the Visibility Graph via Pseudo–Triangulations, 11th Computational Geometry, Vancouver, Canada, 1995 ACM, pp. 248–257.

Powers, K. et al., The 60° Grid: Routing Channels in Width d/square root 3, VLSI, 1991, Proceedings., First Great Lakes Symposium on Kalamazoo, MI, USA, pp 214–291, Mar. 1991.

Royle, J. et al., Geometric Compaction in One Dimension for Channel Routing, 24th ACM/IEEE Design Automation Conference, 1987, pp 140–145.

Schiele, W. et al., A Gridless Router for Industrial Design Rule, 27th ACM–IEEE Design Automation Conference, pp. 626–631, 1990.

Sekiyama, Y. et al., Timing–Oriented Routers for PCB Layout Design of High–Performance Computers, International Conference on Computer Aided Design, pp 332–335, Nov. 1991.

Soukup, J. et al., Maze Router Without a Grid Map, IEEE, 1992, pp. 382–385.

Takashima, Y. et al, Routability of FPGAs with External Switch–Block Structures, IEICE Trans. Fundamentals, vol. E81–A, No. 5, May 1998, pp. 850–856.

Teig, S. The X Architecture: Not your Father's Diagonal Wiring, International Workshop on System Level Interconnect Prediction, pp. 33–37, Apr. 2002.

Thakur, S. et al., Algorithms for a Switch Module Routing Problem, 1994, pp. 265–270.

Theune, D. et al., HERO: Hierarchical EMC–constrained routing, Nov. 1992, IEEE pp 468–472.

Tollis, I. Techniques for Wiring in Non–Square Grids, pp. 66–69, May 1989.

Urrutia, J., On the Number of Internal and External Visibility Edges of Polygons, Department of CS, University of Ottawa, ON, Canada, Feb. 11, 1997.

Wang, D., Novel Routing Schemes for IC Layout, Part I: Two–Layer Channel Routing, 28th ACM/IEEE Automation Conference, 1991, pp. 49–53.

Yan et al., Three–Layer Bubble–Sorting –Based Non–Manhattan Channel Routing, ACM Transactions on Design Automation of Electronic Systems, vol. 5, No. 3, Jul. 2000, pp. 726–734.

Zhou, H. et al., An Optimal Algorithm for River Routing with Crosstalk Constraints, 1996.

Zhou, H. et al., Optimal River Routing with Crosstalk Constraints, ACM Transactions on Design Automation of Electronic Systems, vol. 3, No. 3, Jul. 1998, pp. 496–514.

Cho J.D., Wiring Space and Length Estimation in Two–Dimensional Arrays, May 2000, Computer–Aided Design of Integrated Circuits and Systems, IEEE Transactions on, vol. 19, Iss. 5, pp. 612–615.

Cong J. et al., Dune—A Multilayer Gridless Routing System, May 2001, IEEE Transactions on Computer–Aided Design of Integrated Circuits and Systems, vol. 20, iss. 5, pp. 633–647.

Dion J. et al., Contour: A Tile–based Gridless Router, Mar. 1995, Digital Western Research Laboratory, research Report 95–3, pp. 1–22.

Schultz U., Hierarchical Physical Design System, CompEuro '89, VLSI and Computer Peripherals. VSLI and Microelectronic Applications in Intelligent Peripherals and their Interconnection Networks. Proceedings, May 8–12, 1989, pp. 5/20–5/24.

Tseng H–P. et al., A Gridless Multilayer Router for Standard Cell Circuits Using CTM Cells, Oct. 1999, IEEE Transactions on Computer–Aided Design of Integrated Circuits and Systems, vol. 18, iss. 10, pp. 1462–1479.

* cited by examiner

METHOD AND APPARATUS FOR COSTING ROUTES OF NETS

This patent application claims the benefit of U.S. Provisional Patent Application 60/427,131, filed Nov. 18, 2002.

FIELD OF THE INVENTION

The invention is directed towards a method and apparatus for costing routes of nets.

BACKGROUND OF THE INVENTION

Design engineers design IC's by transforming logical or circuit descriptions of IC's into geometric descriptions, called layouts. IC layouts typically include circuit modules with pins, and interconnect lines that connect the circuit-module pins. A net is typically defined as a collection of pins that need to be connected. A list of all or some of the nets in a layout is referred to as a net list.

To create layouts, design engineers typically use electronic design automation ("EDA") applications. These applications provide sets of computer-based tools for creating, editing, and analyzing IC design layouts. Routers are one type of EDA tool. A router defines routes for interconnect lines that connect the pins of nets.

A router typically receives a routing problem that requires it to identify a route for each net in a net list. Some routers solve such a routing problem by first identifying multiple routes for each net. These routers then try to select a combination of routes that includes one route for each net and that optimizes a particular objective function. The objective function typically expresses one or more metric costs, such as length of routes, congestion in the design, etc.

Routers of this sort use different techniques to select the combination of routes from the set of identified solutions. One technique is randomized rounding. Generally, this technique is a probabilistic method that converts an exact solution of a relaxed problem into an approximate solution to an original problem. With randomized rounding, an EDA router interprets fractional routing solutions (e.g., solutions provided by a linear program) as probabilities for rounding the solutions. Numerous examples of this technique can be found in the literature. One such reference is disclosed in Randomized Algorithms, by Rajeev Motwani and Prabhakar Raghavan, Cambridge University Press (1995, 1997).

Randomized rounding works well in certain situations but not in others. For instance, one type of routing is global routing. Global routing typically identifies routes between cells, which partition the layout into several regions. Such cells are called Gcells. In global routing, randomized rounding works well when the Gcells are large, but does not work as well when the Gcells are small. Therefore, there is a need in the art for a better method for selecting a combination of routes from a set of routes that includes one or more routes for each net in a net list. More generally, there is a need for a better method for solving optimization problems.

SUMMARY OF THE INVENTION

Some embodiments of the invention provide a method of costing routes for a set of nets. The method identifies at least one route for each net, where each route has a particular length. It also identifies an estimated route length for each net. It then computes a cost that includes an exponential expression for each net. Each net's exponential expression includes a base and an exponent. The exponent of each net's exponential expression includes the length of the net's route divided by the estimated route length for the net.

BRIEF DESCRIPTION OF THE DRAWINGS

The novel features of the invention are set forth in the appended claims. However, for the purpose of explanation, several embodiments of the invention are set forth in the following figures.

DETAILED DESCRIPTION OF THE INVENTION

In the following description, numerous details are set forth for the purpose of explanation. However, one of ordinary skill in the art will realize that the invention may be practiced without the use of these specific details. In other instances, well-known structures and devices are shown in block diagram form in order not to obscure the description of the invention with unnecessary detail.

Figure 1A:
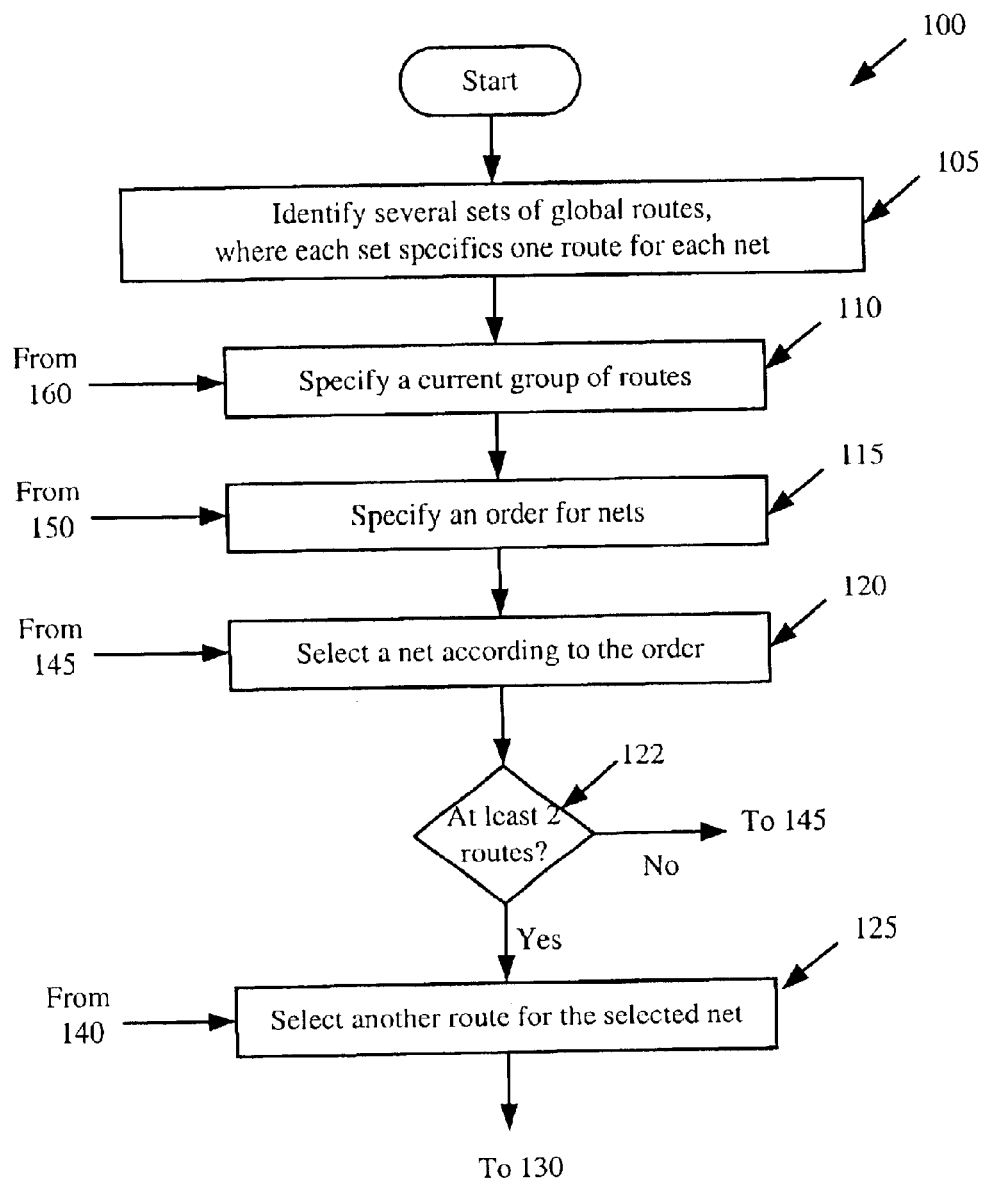
FIG. 1 illustrates a process of some embodiments of the invention.
Figure 1B:
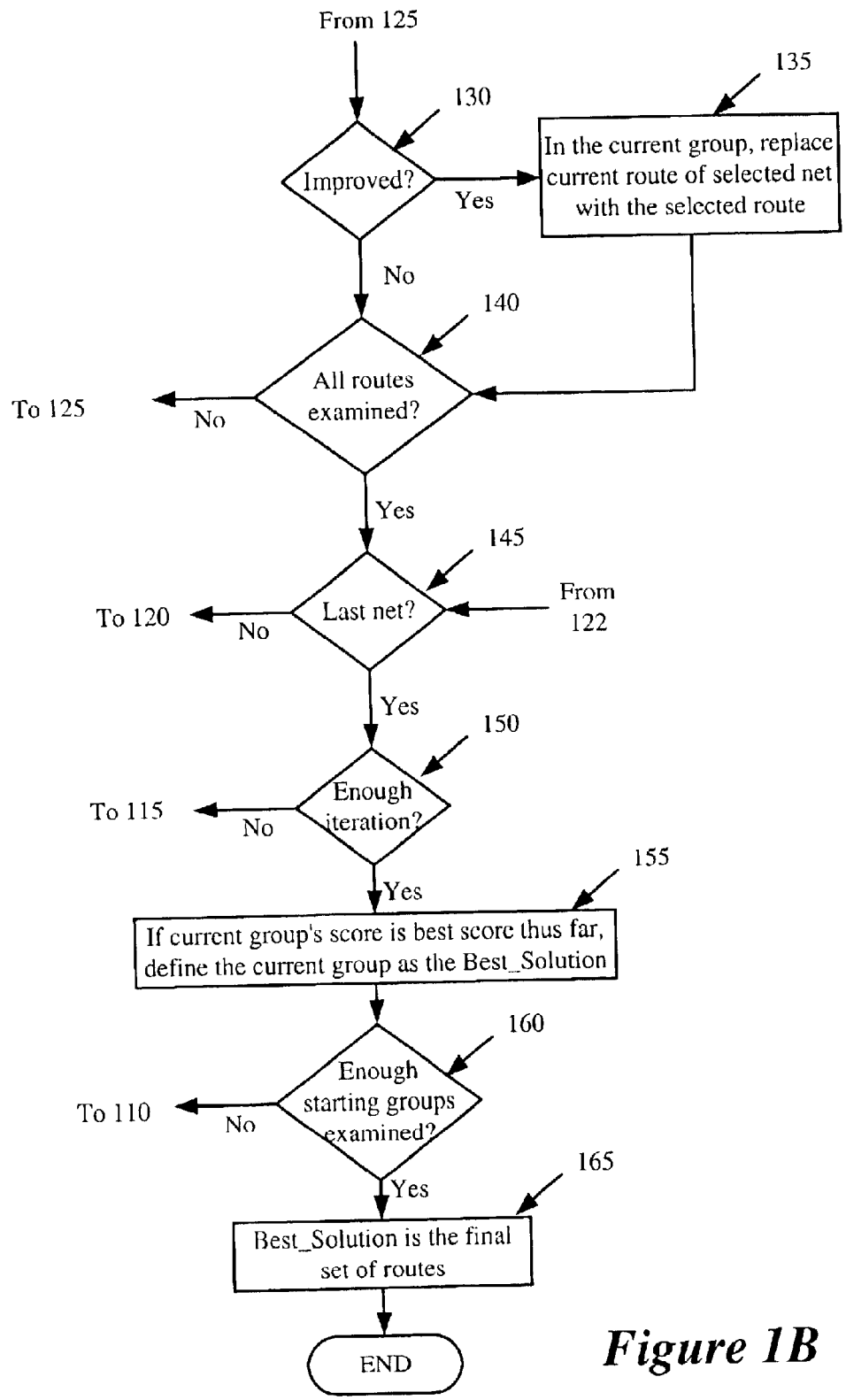

FIG. 1 illustrates a process 100 of some embodiments of the invention. This process solves a global routing optimization problem. This problem requires the process to identify a global route for each net in a netlist. The netlist includes some or all the nets in a region of a design layout. One of ordinary skill will realize that other embodiments might solve other types of optimization problems, such as integer flow and transportation, graph covering and coloring, maximum logic clause satisfaction, etc.

The process 100 solves the routing problem by first identifying several global routes for each net and then exploring the solution space to find an optimal solution. The process 100 can quickly and flexibly identify a good combination of routes for a set of nets. To explore the solution space, the process has three nested loops: an outer loop, a middle loop, and an inner loop. Generally (1) each iteration of the outer loop (which starts at 110) explores the solution space from a different starting group of routes, (2) for a particular starting group of routes, each iteration of the middle loop (which starts at 115) explores the solution space for a particular order of the nets, and (3) for each particular order of the nets, each iteration of the inner loop (which starts at 120) iteratively examines the routes of different nets. These loops are further described below.

The process 100 initially identifies (at 105) several sets of global routes. Each set has one global route for each net in the net list. Different embodiments use different techniques to identify these sets. For instance, some embodiments use techniques like those described in U.S. patent application Ser. No. 10/013,819, filed on Dec. 7, 2001. published as U.S. Patent Application 2003/0079193. Other embodiments use techniques like those described in U.S. patent application Ser. No. 10/334,690 entitled "Method and Apparatus for Routing", published as U.S. patent application 2004/0098695, filed concurrently with the present application. This concurrently filed application is incorporated herein by reference.

Figure 2:
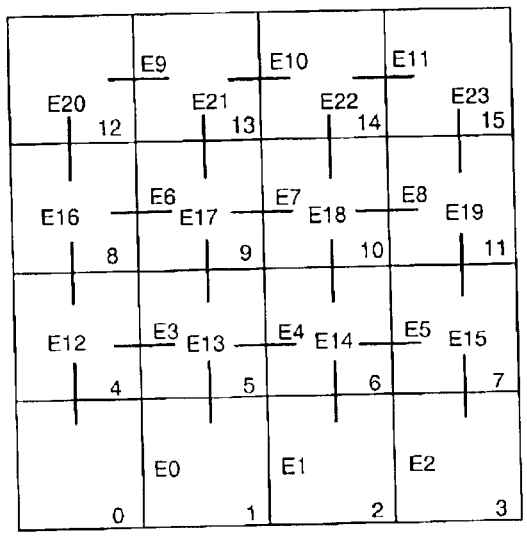
FIGS. 2–4 illustrate several simple examples of Gcells and global routes.
Figure 3:
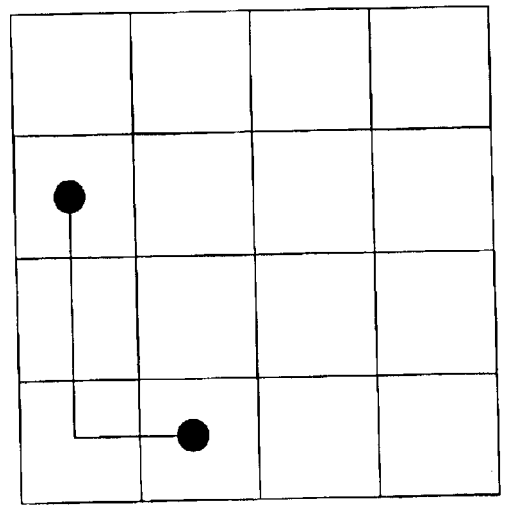
Figure 4:
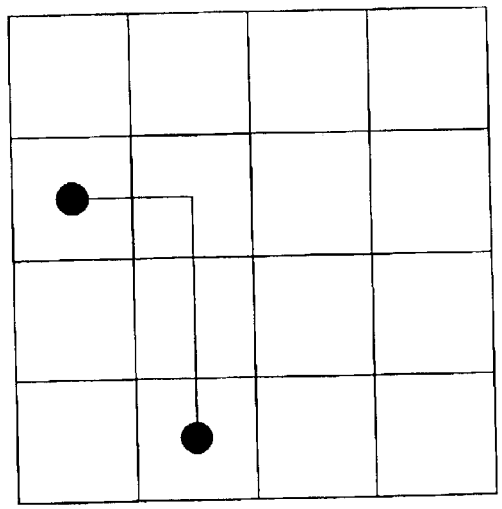

Each identified global route connects several Gcells. Some or all of the Gcells connected by a global route for a net contain routable elements (e.g., pins) of the net. FIGS. 2–4 illustrate simple examples of Gcells and global routes. Specifically, FIG. 2 illustrates a 4×4 partitioning grid that partitions a design-layout region into 16 Gcells, which are numbered as Gcells 0–15. Each of these Gcells can be connected to its neighboring Gcells through one of twenty-four horizontal or vertical edges E0–E23 (illustrated in FIG. 2) between the Gcells. FIGS. 3 and 4 illustrate two global routes for a net that has routable elements in Gcells 1 and 8. Both the routes are equal-length spanning trees. U.S. application Ser. No. 10/013,819 discloses other examples of global routes, including ones with diagonal edges between Gcells. The above-incorporated application also discloses other examples of global routes, Gcells, and diagonal edges.

Figure 5:
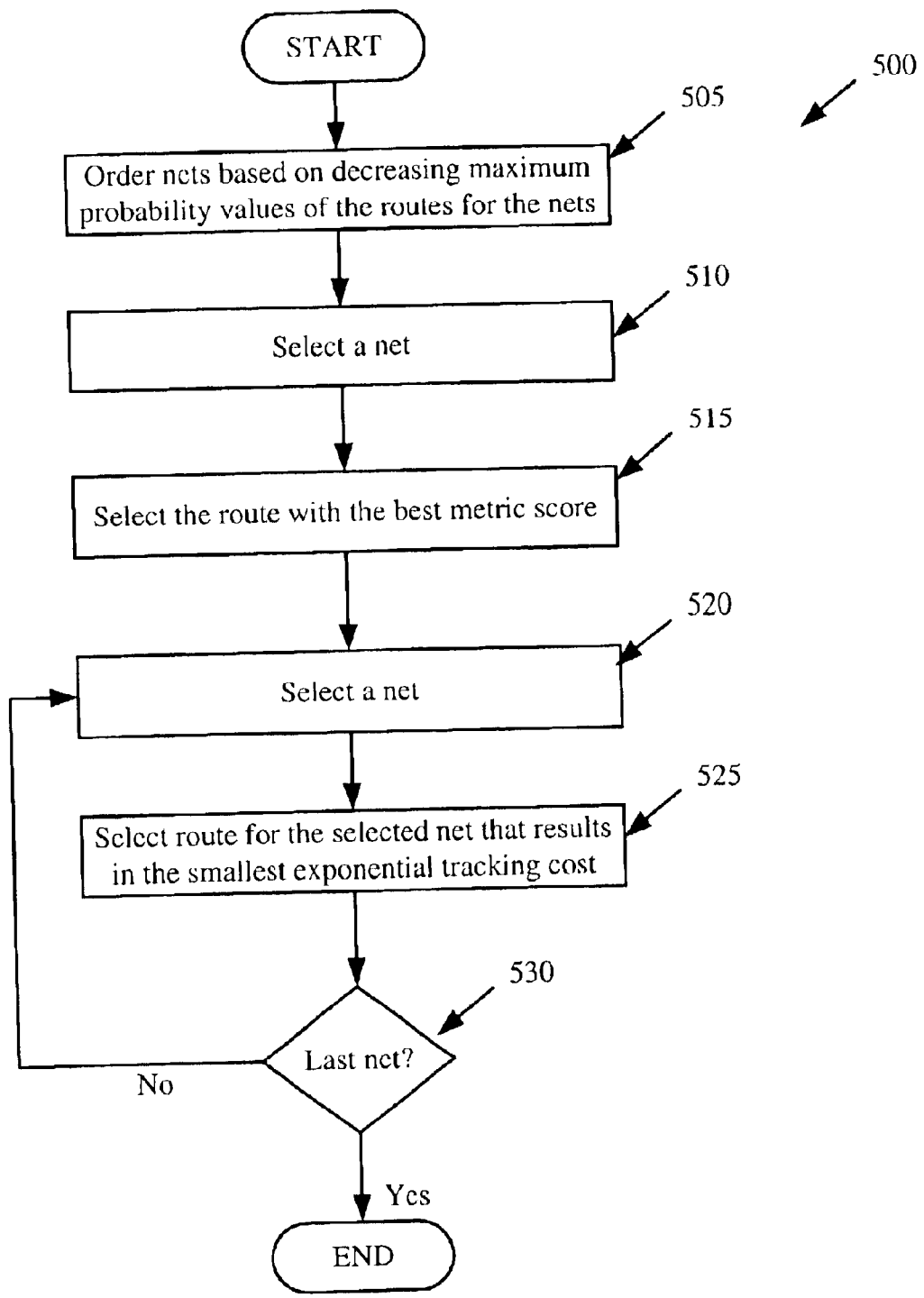
FIG. 5 illustrates a process for specifying a group of routes for a set of nets.

After identifying several sets of global routes at 105, the process specifies (at 110) a current group of routes. The specified group includes a route for each net in the net list. In some embodiments, all the routes in the specified group are from one set of global routes that the process identified at 105. In other embodiments, the routes of the specified group are from two or more of the sets identified at 105. For instance, if the netlist included eight nets, the specified group of routes might include five routes from one identified set and three routes from another identified set. FIG. 5 illustrates how one such group of routes can be specified. This figure is further described below.

After 110, the process specifies (at 115) an order for the nets. Different embodiments use different techniques to specify such an order. For instance, some embodiments specify an order based on descending entropies of the nets, others based on Steiner tree lengths of the nets, and yet others based on bounding boxes of the nets. Still other embodiments randomly order the nets at 115.

The process 100 iterates through 115 several times for a particular starting group of routes that it selects at 110. In one or more of the iterations through 115, the process might specify an order for the nets that is based on the frequency of occurrence of the routes for the nets in the identified set of routes. Specifically, in some embodiments, a net can have the same route in two or more of the sets identified at 105. Accordingly, a frequency parameter (e.g., a probability) can be specified for each identified route of each net. For instance, the process might specify eight sets of routes at 105. However, for a particular net, the eight sets might only include three different routes, a first that is in five sets, a second that is in two sets, and a third that is in only one set. Based on the times that the first, second, and third routes appear in the identified sets, probability values 5/8, 1/4, and 1/8 can be respectively assigned to the first, second, and third routes.

One order that can be specified in an iteration through 115 is an order that is based on descending maximum probability values of the nets. For instance, in a simple example, the net list might include three nets, with the first net having a route that appears in 90% of the identified solutions (specified at 105), the second net having a route that appears in 70% of the identified solutions, and the third net having a route that appears in 55% of the identified solutions. In this example, an order that is based on descending maximum probability values would specify the first net, followed by the second net, followed by the third net. One of ordinary skill will realize that other orders can be specified that are derived from probability values relating to frequency of routes in the identified sets of routes.

After 115, the process 100 selects (at 120) a net according to the order specified at 115. For the net selected at 120, the process then determines (at 122) whether the identified sets of routes include at least two unique routes for the selected net. If not, the process transitions to 145, which is further described below.

Otherwise, the process selects (at 125) a route that is one of the identified routes for the selected net but is not the current route for this net in the current group of routes. The process next determines (at 130) whether replacing the selected net's route in the current group with the route selected at 125 would improve the quality of the routing. This determination entails computing two metric scores. One metric score quantifies the quality of the current group of routes. The other metric score quantifies the quality of the current group of routes with the selected net's route in the current group replaced with the route selected at 125.

Different embodiments of the invention use different objective functions to compute a metric score. Some embodiments use the following function (A), which has two components, a first (congestion) component and a second (length) component.

$$\text{Function} = \sum_{j=1}^{m} Y_j e^{\epsilon 1 * \frac{\text{usage}(j)}{\text{goal}(\text{layer}(j)) * \text{capacity}(j)}} + Y_1 \sum_{n=1}^{p} e^{\epsilon 2 * \frac{\text{length}(n)}{\text{lower\_bound}(n)}}. \quad (A)$$

In this function, (1) j represents one of m edges between Gcells, (2) e is the base of the natural logarithm, (3) $\epsilon 1$ and $\epsilon 2$ are user-adjustable parameters, (4) usage(j) is the number of routes in the group of routes that use the edge j, (5) capacity(j) is the estimated maximum number of available tracks along the edge j, (6) goal(layer(j)) is a target upper bound on the congestion ratio on the design-layout layer that contains edge j, (7) n is one of the p nets in the netlist, (8) length(n) is the length of the route of net n in the group of nets, (9) lower_bound(n) is a lower bound for the route length of the net n, and (10) $Y_j$ and $Y_1$ are constants that normalize the length and congestion components. When this function is used, a smaller metric score means better quality.

In some embodiments, an edges j in function (A) can be a planar or non-planar edge. A non-planar edge represents a via, which typically is a transition between two adjacent layers within a Gcell. Accordingly, in these embodiments, the congestion component of function (A) not only accounts for planar congestion, but also accounts for via (non-planar) congestion. Instead of merging the via congestion cost into the overall congestion cost, the function (A) in other embodiments can have a third component that expresses the via congestion cost. Having a third component would allow the user-adjustable epsilon parameter $\epsilon$ for via congestion to be different than the user-adjustable epsilon parameter for the planar wire congestion.

If the quality (i.e., the metric score) of the current group of routes does not improve with the route selected at 125, the process transitions from 130 to 140, which is further described below. On the other hand, if the quality of the current group of routes improves with the route selected at 125, the process replaces (at 135) the selected net's current route in the group with the route selected at 125, and then transitions to 140.

At 140, the process determines whether, during its current loop through 120–145 (i.e., during the current instance of the inner loop), it has examined all the routes that it identified at 105 for the selected net. If not, the process transitions back to 125 to select, for the selected net, a route that it has not yet examined in its current loop through 120–145.

Otherwise, the process determines (at 145) whether it has examined all the nets in the netlist during its current loop through 115–150 (i.e., during the current instance of the middle loop). If not, the process transitions back to 120 to select another net according to the order specified at 115.

When the process determines (at 145) that it has examined all the nets in the netlist during its current loop through 115–150, it determines (at 150) whether it has examined enough permutations of routes based on the same initial group of routes that were specified at 110. Different embodiments base the determination at 150 on different criteria. Examples of such criteria include the number of iterations, the percentage of improvement in the routing quality between the last two or more iterations, etc. Some embodiments might base this determination on different criteria during different iterations through 150.

If the process determines (at 150) that it has not examined enough permutations, the process transitions back to 115 to specify an order for the nets. In some embodiments, this new order is different from all the orders that the process set in its previous iterations through 115, while, in other embodiments, this order might be the same as one of the previously set ones. For the newly specified order, the process then performs operations 120–150 as described above.

Once the process 100 determines (at 150) that it has done enough iterations through the nets for the starting solution specified at 110, the process compares (at 155) the metric score of the current group of routes with a Best_Score that represents the score of the best group of routes that the process has identified up to this stage. If the current group's score is better than the Best_Score, the process stores (at 155) the current group of routes as the Best_Solution that it has encountered up to this stage. At the start of the process 100, some embodiments initialize the Best_Score to a very large number.

Next, the process determines (at 160) whether it has started its exploration of the solution space from a sufficient number of different starting points. If not, the process transitions back to 110 to specify another initial group of routes as the current group of routes. In some embodiments, this group of routes is different from all the groups that the process previously specified in its previous iteration through 110. For the newly specified group, the process then performs operations 115–160 as described above. When the process determines (at 160) that it has examined enough starting points for its search, the process identifies (at 165) the Best_Solution as the solution to the routing problem. The process then terminates.

FIG. 5 illustrates a process 500 that specifies a group of routes for a set of nets after a set of routes has been defined for each net in the set. The set of nets includes at least two nets. Also, in some embodiments, the set of routes for each net includes at least one route. Some embodiments use this process to define one of the starting groups of routes at 110 of the process 100.

The process 500 iteratively selects one identified route for each net. Specifically, during each iteration, the process selects the identified route that least increases an exponential tracking cost, as further described below. The process 500 initially orders the nets based on decreasing maximum probability values of the routes for the nets. Such probability values and orders based on such values were described above in connection with operation 115 of process 100.

After 505, the process 500 selects (at 510) the first net according to the order specified at 505. It then selects (at 515) the route for the first net that has the best metric score. In some embodiments, the process uses the following objective function (B) to compute the metric scores of each route for the first net.

$$\text{Function} = Y_1 * e^{\varepsilon 2 * \frac{\text{length(net)}}{\text{lower\_bound(net)}}} + \sum_{j=1}^{m} Y_j e^{\varepsilon 1 * \frac{\text{usage}(j)}{\text{goal(layer}(j))*\text{capacity}(j)}} \quad (B)$$

In this function, (1) j represents one of m edges between Gcells, (2) e is the base of the natural logarithm, (3) $\varepsilon 1$ and $\varepsilon 2$ are user-adjustable parameters, (4) usage(j) indicates whether the route uses the edge j, (5) capacity(j) is the estimated maximum number of available tracks along the edge j, (6) goal(layer(j)) is a target upper bound on the congestion ratio on the design-layout layer that contains edge j, (7) net is the selected first net, (8) length(net) is the length of the route for the net, (9) lower_bound(net) is the lower bound for the route length of the net, and (10) $Y_j$ and $Y_1$ are constants that normalize the length and congestion components.

The process then selects (at 520) the next net according to the order specified at 505. From the set of routes identified for the selected net, the process then selects (at 525) the route that results in the smallest exponential tracking metric score. Some embodiments use the following function (C), which is similar to the above-described function (A).

$$\text{Function} = \sum_{j=1}^{m} Y_j e^{\varepsilon 1 * \frac{\text{usage}(j)}{\text{goal(layer}(j))*\text{capacity}(j)}} + Y_1 \sum_{n=1}^{p} e^{\varepsilon 2 * \frac{\text{length}(n)}{\text{lower\_bound}(n)}}. \quad (C)$$

In this function, (1) j represents one of m edges between Gcells, (2) e is the base of the natural logarithm, (3) $\varepsilon 1$ and $\varepsilon 2$ are user-adjustable parameters, (4) usage(j) is the number of routes that have been selected thus far that use the edge j, (5) capacity(j) is the estimated maximum number of available tracks along the edge j, (6) goal(layer(j)) is a target upper bound on the congestion ratio on the design-layout layer that contains edge j, (7) n is one of the p nets selected thus far, (8) length(n) is the length of the route of net n, (9) lower_bound(n) is a lower bound for the route length of the net n, and (10) $Y_j$ and $Y_1$ are constants that normalize the length and congestion components.

To select (at 525) the route for the selected net, some embodiments compute the value of function (C) for each route in the set of routes identified for the selected net. For each particular route of the selected net, the function (C) is computed for a set of routes that includes the particular route and all routes previously selected (at 510 or 525) for previously selected nets.

After 525, the process determines (at 530) whether it has selected a route for each net. If not, the process selects (at 520) the next net according to the specified order, and then selects (at 525) the route (from the set of routes identified for the selected net) that results in the smallest exponential tracking metric score. When the process determines at 530 that it has selected a route for each net, it terminates.

Figure 6:
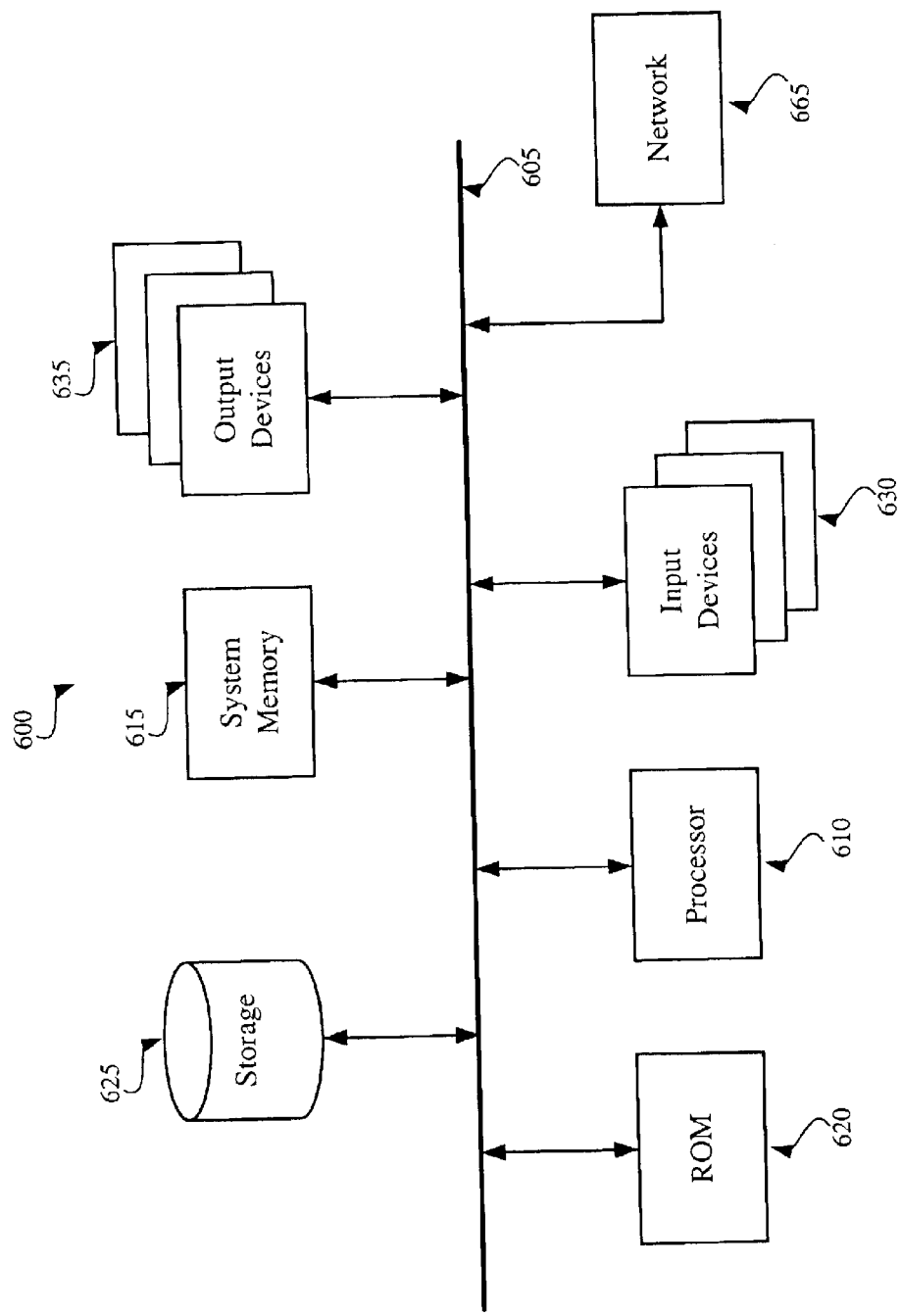
FIG. 6 conceptually illustrates a computer system with which one embodiment of the invention is implemented.

FIG. 6 presents a computer system with which one embodiment of the present invention is implemented. Computer system 600 includes a bus 605, a processor 610, a system memory 615, a read-only memory 620, a permanent storage device 625, input devices 630, and output devices 635.

The bus 605 collectively represents all system, peripheral, and chipset buses that support communication among internal devices of the computer system 600. For instance, the bus 605 communicatively connects the processor 610 with the read-only memory 620, the system memory 615, and the permanent storage device 625.

From these various memory units, the processor 610 retrieves instructions to execute and data to process in order to execute the processes of the invention. The read-only-memory (ROM) 620 stores static data and instructions that are needed by the processor 610 and other modules of the computer system. The permanent storage device 625, on the other hand, is a read-and-write memory device. This device is a non-volatile memory unit that stores instruction and data even when the computer system 600 is off. Some embodiments of the invention use a mass-storage device (such as a magnetic or optical disk and its corresponding disk drive) as the permanent storage device 625. Other embodiments use a removable storage device (such as a floppy disk or zip® disk, and its corresponding disk drive) as the permanent storage device.

Like the permanent storage device 625, the system memory 615 is a read-and-write memory device. However, unlike storage device 625, the system memory is a volatile read-and-write memory, such as a random access memory. The system memory stores some of the instructions and data that the processor needs at runtime. In some embodiments, the invention's processes are stored in the system memory 615, the permanent storage device 625, and/or the read-only memory 620.

The bus 605 also connects to the input and output devices 630 and 635. The input devices enable the user to communicate information and select commands to the computer system. The input devices 630 include alphanumeric keyboards and cursor-controllers. The output devices 635 display images generated by the computer system. For instance, these devices display IC design layouts. The output devices include printers and display devices, such as cathode ray tubes (CRT) or liquid crystal displays (LCD).

Finally, as shown in FIG. 6, bus 605 also couples computer 600 to a network 665 through a network adapter (not shown). In this manner, the computer can be a part of a network of computers (such as a local area network ("LAN"), a wide area network ("WAN"), or an Intranet) or a network of networks (such as the Internet). Any or all of the components of computer system 600 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. For instance, some embodiments might use different cost functions than those described above. Several of the above-described cost functions divide the length of each net's route by a lower-bound for the route length of the net. Instead of the lower-bound, other embodiments might use as a divisor another estimate of route length for the net. For example, some embodiments might use the length of a congestion-unaware route for the net. The generation of a congestion-unaware route is described in the above-incorporated application.

Also, the cost function of some embodiments might include only congestion components and not include any wirelength components. Alternatively, some embodiments might use a different wirelength component, such as $$\text{Wirelength Component} = Y_L * e^{\varepsilon L * \frac{\sum_{n=1}^{p} \text{Length}(n)}{T.E.L}},$$

where T.E.L. is the total length of the estimated routes (e.g., congestion-unaware routes) for the p nets. The estimated lengths could be the lower-bound lengths or some other estimated lengths. Other embodiments might use an equation that uses both this wirelength component and the wirelength component of the above-described equations. Still other embodiments might slightly modify the wirelength component of the above-described equations slightly.

For instance, some embodiments described above express the wirelength component as $$Y_1 \sum_{n=1}^{p} e^{\varepsilon 2 * \frac{\text{length}(n)}{\text{lower\_bound}(n)}}.$$

Instead of this formulation, some embodiments might use $$Y_1 \sum_{n=1}^{p} e^{\varepsilon 2 * \frac{\text{length}(n)}{B(n) * \text{lower\_bound}(n)}},$$

where B is a factor related to the importance of the net. This factor B is smaller (e.g., it is 1) for important critical nets (e.g., time critical nets) that need shorter routes, while it is larger (e.g., it is 3) for non-critical nets that can have longer routes. Accordingly, this factor causes the selection of shorter routes for critical nets, by increasing the wirelength cost of these nets much faster than the wirelength cost of non-critical nets. One of ordinary skill will realize that the net-importance factor B can also be multiplied by the net's route length (i.e., by length(n)). In this situation, the factor B is larger for an important time-critical net, and is smaller for a non-critical net.

Several embodiments were described above for solving a global routing optimization problem. One of ordinary skill will realize, however, that other embodiments can be used to solve other classes of optimization problems. In addition, the process 100 initially identifies (at 105) sets of solutions, where each set includes a global route for each net in the net list. Other embodiments, however, might not identify such sets. For instance, some embodiments might just identify (at 105) one or more routes for each net, and then specify (at 110) different starting groups of routes by selecting different routes for some or all of the nets. Thus, one of ordinary skill in the art would understand that the invention is not to be limited by the foregoing illustrative details, but rather is to be defined by the following claims.

We claim:

1. A method of costing routes for a set of nets in an integrated circuit ("IC") layout, the method comprising:
    a) identifying at least one route for each net in the IC layout, wherein each route has a particular length;
    b) identifying an estimated route length for each net; and
    c) computing a routing cost of the IC layout that includes an exponential expression for each net, wherein each net's exponential expression includes a base and an exponent, wherein the exponent of net's exponential expression includes the length of the net's route divided by the estimated route length for the net.

2. The method of claim 1, wherein the exponent of each net's exponential expression further includes an importance factor that adjusts the result of the division of the net's route length by the net's estimated route length to reflect the importance of the net.

3. The method of claim 2, wherein at least two nets have different importance factors.

4. The method of claim 2, wherein the importance factor of a net is multiplied by the estimated route length of the net in the exponent of the net's exponential expression.

5. The method of claim 2, wherein the importance factor of a net is multiplied by the length of the net's route in the exponent of the net's exponential expression.

6. The method of claim 1, wherein computing the routing cost comprises summing the exponential expressions.

7. The method of claim 1, wherein identifying at least one route for each net comprises:
   a) identifying a set of routes for each net; and
   b) selecting one route for each net from the identified set of routes for the net.

8. The method of claim 7 further comprising;
   a) examining different combination of routes of the nets; and
   b) for each combination of routes, computing a routing cost of the IC layout that includes an exponential expression for each net, wherein each net's exponential expression includes a base and an exponent, wherein the exponent of each net's exponential expression includes the length of the net's route in the combination divided by the estimated route length for the net.

9. The method of claim 8 further comprising selecting the combination of routes that results in the lowest computed routing cost of the IC layout.

10. The method of claim 1, wherein the nets are nets within a region of the integrated circuit layout.

11. A computer readable medium that stores a computer program for costing routes for a set of nets in an integrated circuit ("IC") layout, the computer program comprising sets of instructions for:
   a) identifying at least one route for each net in the IC layout, wherein each route has a particular length;
   b) identifying an estimated route length for each net; and
   c) computing a routing cost of the IC layout that includes an exponential expression for each net, wherein each net's exponential expression includes a base and an exponent, wherein the exponent of net's exponential expression includes the length of the net's route divided by the estimated route length for the net.

12. The computer readable medium of claim 11, wherein the exponent or each net's exponential expression further includes an importance factor that adjusts the results of the division of the net's route length by the net's estimated route length to reflect the importance of the net.

13. The computer readable medium of claim 12, wherein at least two nets have different importance factors.

14. The computer readable medium of claim 12, wherein the importance factor of a net is multiplied by the estimated route length of the net in the exponent of the net's exponential expression.

15. The computer readable medium of claim 12, wherein the importance factor of a net is multiplied by the length of the net's route in the exponent of the net's exponential expression.

16. The computer readable medium claim 11, wherein the set for computing the routing cost comprises a set of instructions for summing the exponential expressions.

17. The computer readable medium of claim 11, wherein the set of instructions for identifying at least one route for each net comprises sets of instructions for:
   a) identifying a set of routes for each net; and
   b) selecting one route for each net from the identified set of routes for the net.

18. The computer readable medium of claim 17, wherein the computer program further comprises sets of instructions for;
   a) examining different combination of routes of the nets; and
   b) for each combination of routes, computing a routing cost of the IC layout that includes an exponential expression for each net, wherein each net's exponential expression includes a base and an exponent, wherein the exponent of each net's exponential expression includes the length of the net's route in the combination divided by the estimated route length for the net.

19. The computer readable medium of claim 18, wherein the computer program further comprises a set of instructions for selecting the combination of routes that results in the lowest computed routine cost of the IC layout.

20. The computer readable medium of claim 11, wherein the nets are nets within a region of the integrated circuit layout.

* * * * *

UNITED STATES PATENT AND TRADEMARK OFFICE
CERTIFICATE OF CORRECTION

PATENT NO. : 6,892,369 B1
DATED : May 10, 2005
INVENTOR(S) : Steven Teig et al.

It is certified that error appears in the above-identified patent and that said Letters Patent is hereby corrected as shown below:

Column 2,
Lines 54-59, DETAILED DESCRIPTION OF THE INVENTION reads "techniques like those described in U.S. patent application Ser. No. 10/013.819, filed on Dec. 7, 2001. published as U.S. Patent Application 2003/0079193. Other embodiments use techniques like those described in U.S. patent application Ser. No. 10/334,690 entitled "Method and Apparatus for Routing", published U.S. patent application 2004/" should read
-- techniques like those described in U.S. Patent Application 10/013,819, filed on Dec. 7, 2001, published as U.S. Patent Application 2003/0079193. Other embodiments use techniques like those described in U.S. Patent Application 10/334,690, entitled "Method and Apparatus for Routing", published as U.S. Patent Application 2004/ --.

Column 10,
Line 34, reads "lowest computed routine cost of the IC layout." should read -- lowest computed routing cost of the IC layout. --.

Signed and Sealed this

Twenty-fourth Day of January, 2006

JON W. DUDAS
*Director of the United States Patent and Trademark Office*